US010064309B2

(12) United States Patent
Chen et al.

(10) Patent No.: US 10,064,309 B2
(45) Date of Patent: Aug. 28, 2018

(54) SHELF THERMOSTAT DEVICE AND THERMOSTAT SYSTEM

(71) Applicant: DELTA ELECTRONICS, INC., Taoyuan (TW)

(72) Inventors: Lee-Lung Chen, Taoyuan (TW); Tse-Hsin Wang, Taoyuan (TW); Ying-Chi Chen, Taoyuan (TW); Wu-Chi Li, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 19 days.

(21) Appl. No.: 15/429,541

(22) Filed: Feb. 10, 2017

(65) Prior Publication Data
US 2017/0257976 A1    Sep. 7, 2017

(30) Foreign Application Priority Data
Mar. 3, 2016  (CN) .......................... 2016 1 0121127

(51) Int. Cl.
*H05K 7/20* (2006.01)
(52) U.S. Cl.
CPC ......... *H05K 7/202* (2013.01); *H05K 7/20209* (2013.01); *H05K 7/20736* (2013.01); *H05K 7/20745* (2013.01)
(58) Field of Classification Search
CPC .. G06F 1/20; H05K 7/20572; H05K 7/20581; H05K 7/20563; H05K 7/20145; H05K 7/207; H05K 7/20209; H05K 7/20727; H05K 7/20754; H05K 7/202; H05K 7/20672; H05K 5/0021; H05K 7/20154; H05K 7/206
See application file for complete search history.

(56) References Cited

U.S. PATENT DOCUMENTS

| 7,426,111 B2 * | 9/2008 | Sonobe | H05K 7/20572 361/694 |
| 7,804,690 B2 * | 9/2010 | Huang | H05K 7/20736 312/223.2 |
| 9,007,764 B2 * | 4/2015 | Fujii | H05K 7/20145 165/104.33 |
| 9,795,066 B2 * | 10/2017 | Dong | H02M 7/003 |
| 2013/0343110 A1 * | 12/2013 | Liu | H02M 7/003 363/141 |
| 2017/0027083 A1 * | 1/2017 | Bai | H05K 7/20509 |
| 2017/0172011 A1 * | 6/2017 | Chen | H05K 7/20636 |

* cited by examiner

*Primary Examiner* — James Wu
*Assistant Examiner* — Michael Matey
(74) *Attorney, Agent, or Firm* — Muncy, Geissler, Olds & Lowe, P.C.

(57) ABSTRACT

A shelf thermostat device and a thermostat system. The shelf thermostat device includes a fixing bracket and a heat exchanger. An electronic device is detachably disposed at the fixing bracket. The heat exchanger is detachably disposed at the fixing bracket and layer arranged in a row with the electronic device. The heat exchanger has a heat exchanging core. The heat exchanging core has a first side and a second side opposite to the first side, and a plurality of internal channels and a plurality of external channels. The internal channels and the external channels are disposed staggered and isolated with each other. An internal air flows between the internal channels and the electronic device. An external air flows to the second side of the heat exchanging core from the first side of the heat exchanging core through the external channels.

20 Claims, 9 Drawing Sheets

SHELF THERMOSTAT DEVICE AND THERMOSTAT SYSTEM

CROSS REFERENCE TO RELATED APPLICATIONS

This Non-provisional application claims priority under 35 U.S.C. § 119(a) on Patent Application No(s). 201610121127.8 filed in People's Republic of China on Mar. 3, 2016, the entire contents of which are hereby incorporated by reference.

BACKGROUND

Technical Field

The present invention relates to a shelf thermostat device and thermostat system having the same.

Related Art

With the development of the electronic industry, requirement for operation speed and efficacy of the electronic components is rising. However, derived heat dissipating problem is getting worse, thereby affecting the performance and stability during operation. To maintain normal operation, heat dissipating elements are usually installed on the heat generating electronic component to export the heat. The heat dissipating device currently used for electronic device is mainly a heat exchanging device. By disposing the heat exchanging device in the electronic device, the cold airflow outside of the electronic device is able to exchange with the hot airflow inside of the electronic device, thus reducing the temperature inside of the electronic device.

FIGS. 1A and 1B show a perspective view and a schematic view of airflow path of a conventional heat exchanging device, respectively.

Conventional heat exchanging device 1 includes a case 10, a heat exchanger 11, a first fan 12 and a second fan 13. The heat exchanger 11, the first fan 12 and the second fan 13 are disposed inside of the case 10, and the heat exchanger 11 and the case 10 are defined and forming an internal circulating path 14 and an external circulating path 15 which are isolated from each other. The first fan 12 is disposed in the internal circulating path 14 and configured to actuate the internal air; that is, the first fan 12 guides the hot air generated from the heating element 91 of the electronic device 9 flowing from one side of the case 10 into the internal circulating path 14 of the heat exchanging device 1. In the meantime, the second fan 13 is disposed in the external circulating path 15 and configured to actuate the external air; that is, the second fan 13 guides the cold air outside of the electronic device 9 flowing from another side of the case 10 into the external circulating path 15 of the heat exchanging device 1. Hence, the heat exchanger 11 is capable of exchanging the internal air with relative high temperature and external air with relative low temperature, thus reducing the temperature of the internal air and providing the internal air to the heating element 91 of the electronic device 9, further reducing the internal temperature of the electronic device 9.

However, installation space for the heat exchanging device 1 should be reserved in advance while using the conventional heat exchanging device 1 to reduce the temperature inside of the electronic device 9 so that the thickness and the volume of case 10 become larger. In addition, the second fan 13 of the heat exchanging device 1 used for guiding the external air is extended out of the electronic device 9. Noise will be directly transmitted outside of the electronic device 9 while the second fan 13 is operating. In addition, the second fan 13 extended out of the electronic device 9 also need to strengthen the waterproof and dustproof level to prevent the water or dust entering into the second fan and reducing the product life of fan. Otherwise, the heating element 91 might have the problem of uneven due to the unequal position between the heating elements 91 and the heat exchanging device 1 while there are too many heating elements 91.

SUMMARY

The present invention is to provide a shelf thermostat device and a thermostat system. The shelf thermostat device can be designed according to the heat exchange requirements of the electronic device without modifying the case, and the electronic device will not have the problem of uneven heat dissipation or heating. In addition, the fan operation sound of shelf thermostat device is unable to transmit to the external environment so that the noise problem can be solved. There is no need to strengthen the waterproof and dustproof level. Furthermore, the shelf thermostat device and the thermostat system having the same are both modular design, so that the installation and maintenance is convenient and easy.

The present invention is to provide a shelf thermostat device applied with at least one electronic device. The shelf thermostat device includes a fixing bracket and a heat exchanger. The electronic device is detachably disposed at the fixing bracket. The heat exchanger detachably disposed at the fixing bracket and layer arranged in a row with the electronic device. The heat exchanger has a heat exchanging core having a first side, a second side opposite to the first side, a plurality of internal circulating channels, and a plurality of external circulating channels. The internal channels and the external channels are disposed staggered and isolated with each other, and an internal air flows between the internal channels and the electronic device, and an external air flows to the second side of the heat exchanging core from the first side of the heat exchanging core through the external channels. Wherein the heat exchanger constructs a hermetic circuit together with the electronic device or the fixing bracket, and the internal air flows in the hermetic circuit.

In one embodiment of the present invention, the shelf thermostat device further comprises at least a first fan disposed at the first or second sides of the heat exchanging core, and the first fan operates to form the external air. The shelf thermostat device further comprises at least a second fan disposed at a third or a fourth side opposite to the third side, the third and fourth sides are located between the first and second sides, respectively, and the second fan operates to form the internal air.

In one embodiment of the present invention, the shelf thermostat device further comprises a support housing and two air shields, the heat exchanging core is disposed at the fixing bracket by the support housing. Wherein the support housing includes two branch portions corresponding to the third and fourth sides, the air shields are correspondingly disposed at the branch portions and covering the two openings of the electronic device, respectively.

The present invention further provides a shelf thermostat device applied with at least one electronic device. The shelf thermostat device includes a fixing bracket and a temperature regulator. The electronic device is detachably disposed at the fixing bracket. The temperature regulator is detachably disposed at the fixing bracket and layer arranged in a row with the electronic device.

In one embodiment of the present invention, the temperature regulator is a heat exchanger. In another embodiment, the temperature regulator is a heater.

The present invention further provides a thermostat system comprising a main body, at least an electronic device, and at least a shelf thermostat device. The main body includes an accommodating space. The electronic device is disposed at the accommodating space so that the shelf thermostat device is disposed at the accommodating space and applied with the electronic device. The shelf thermostat device comprises a fixing bracket and a temperature regulator, wherein the electronic device is detachably disposed at the fixing bracket, and the temperature regulator is detachably disposed at the fixing bracket and layer arranged in a row with the electronic device.

In one embodiment of the present invention, the main body is a building or a cabinet.

In one embodiment of the present invention, the temperature regulator is a heater, and the electronic overlays on the heater.

In one embodiment of the present invention, the thermostat system further comprises at least a bulkhead configured to separate the external air corresponding to the first and second sides.

As mentioned above, the shelf thermostat device and the thermostat system of the present invention can be designed according to the heat exchange requirements of the electronic device. Compared to the prior techniques, the shelf thermostat device of the present invention do not need to modify the case, and the electronic device will not have the problem of uneven heat dissipation or heating. The fan operation sound of shelf thermostat device is unable to transmit to the external environment so that the noise problem can be solved and the waterproof and dustproof level are not necessary to strengthen. The shelf thermostat device and the thermostat system having the same are both modular design, any broken shelf thermostat device can be easily swapped so that the installation and maintenance is also very convenient and easy.

BRIEF DESCRIPTION OF THE DRAWINGS

The embodiments will become more fully understood from the detailed description and accompanying drawings, which are given for illustration only, and thus are not limitative of the present invention, and wherein.

DETAILED DESCRIPTION OF THE INVENTION

The embodiments of the invention will be apparent from the following detailed description, which proceeds with reference to the accompanying drawings, wherein the same references relate to the same elements. All the embodiments and figures of the present invention are just for schematic and are not intended to reflect the true size and proportion. Otherwise, the word "on", "upon", "above", "under", "below", and "underneath" descripted in the following embodiment are used for showing the relative position between elements. Furthermore, the description "an element forming "on", "above", "under" or "below" another element" means direct contact between the two elements, or no contact between the two elements since there is an additional element disposed between the two elements.

Figure 1A:
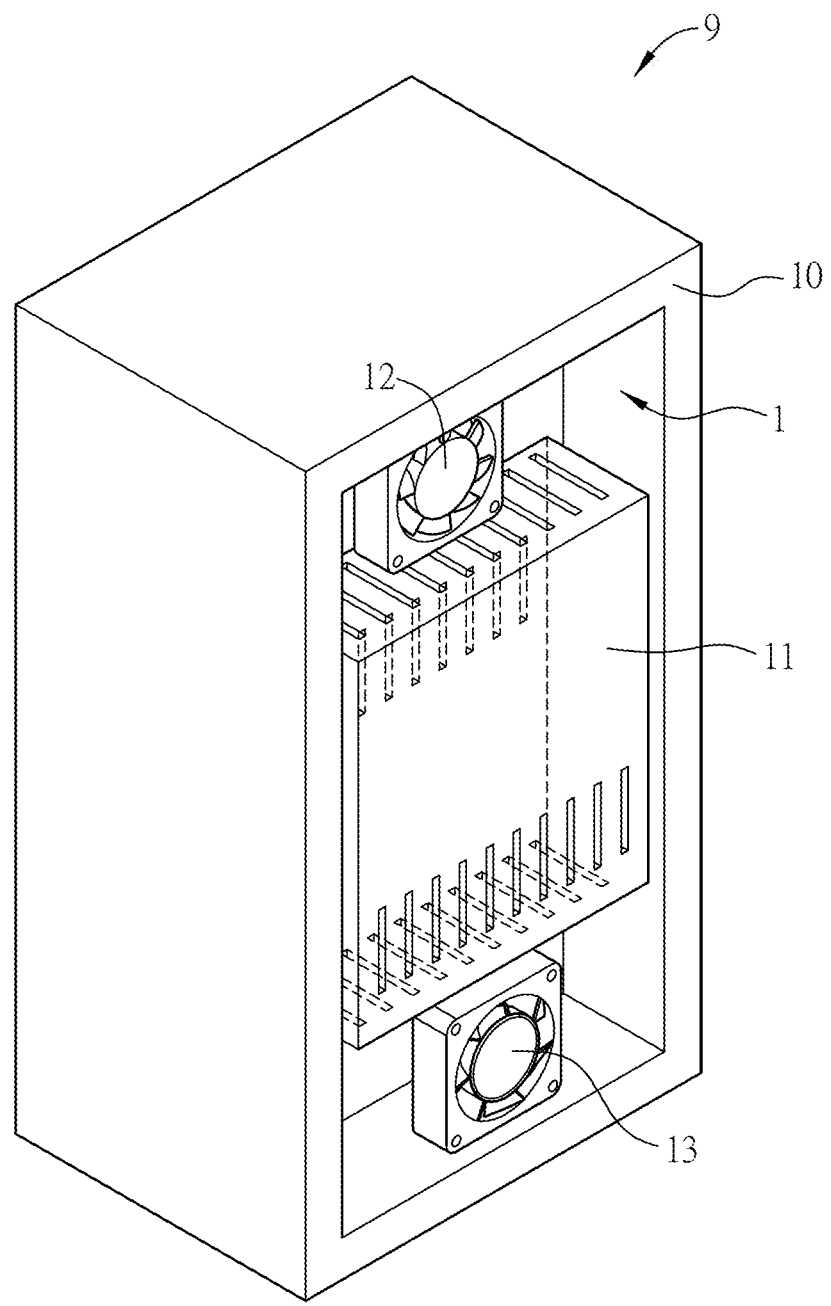
FIG. 1A shows a perspective view of a conventional heat exchanging device.
Figure 1B:
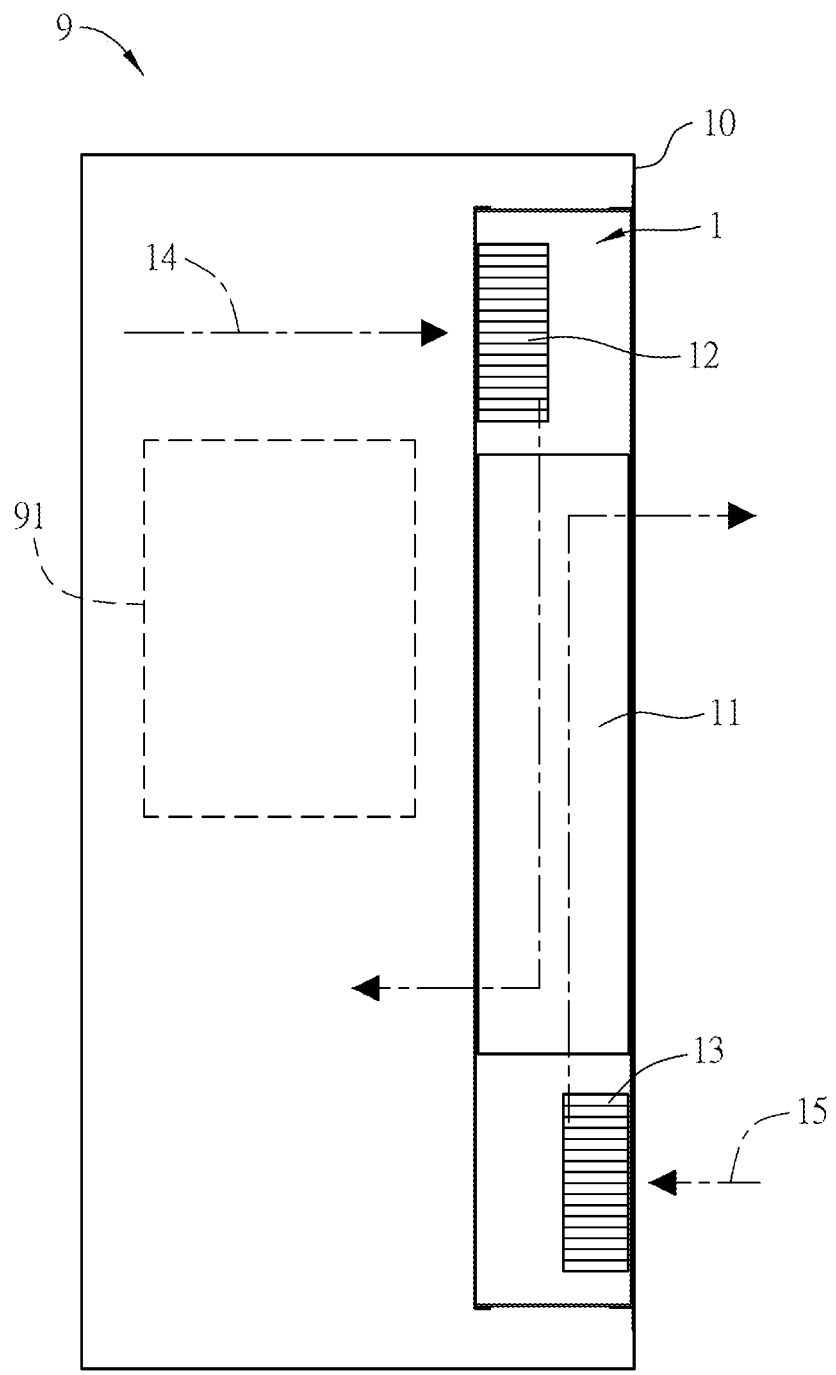
FIG. 1B shows a schematic view of airflow path of a conventional heat exchanging device.
Figure 2A:
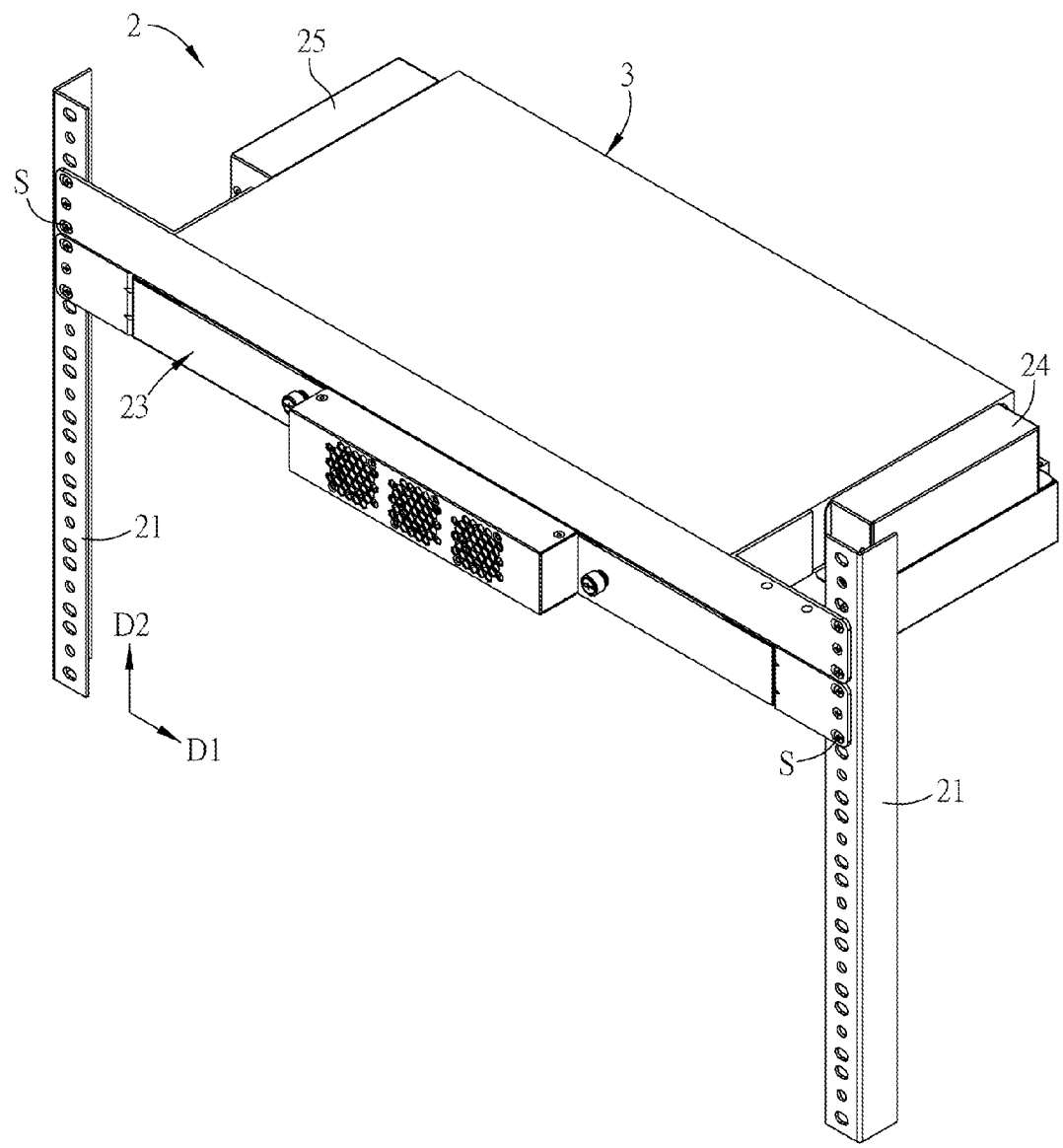
FIG. 2A to FIG. 2D are an assembly figure, a decomposition figure and a schematic view of airflow path, respectively, of a shelf thermostat device and an electronic device according to a preferred embodiment of the present invention.
Figure 2B:
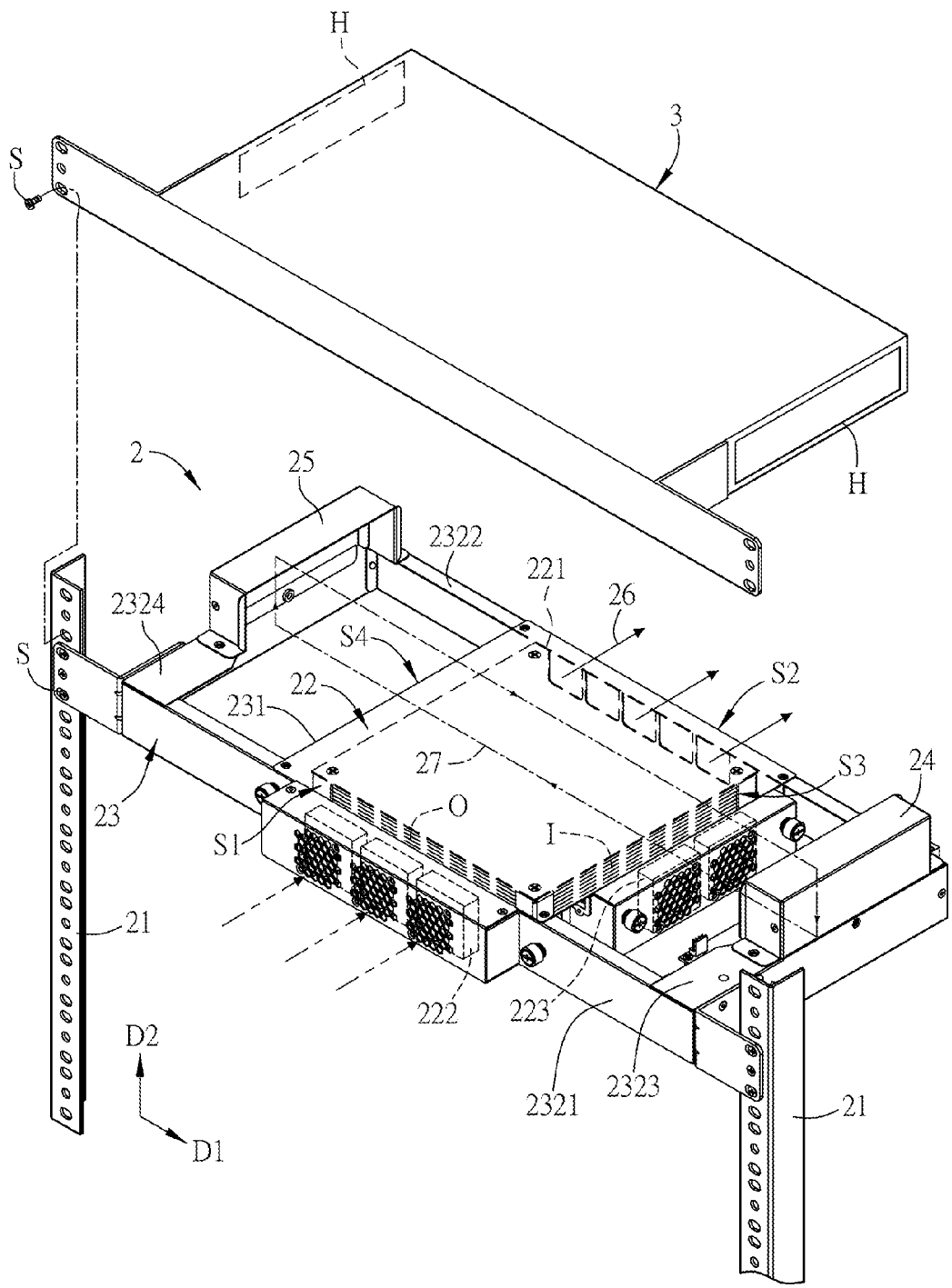
Figure 2C:
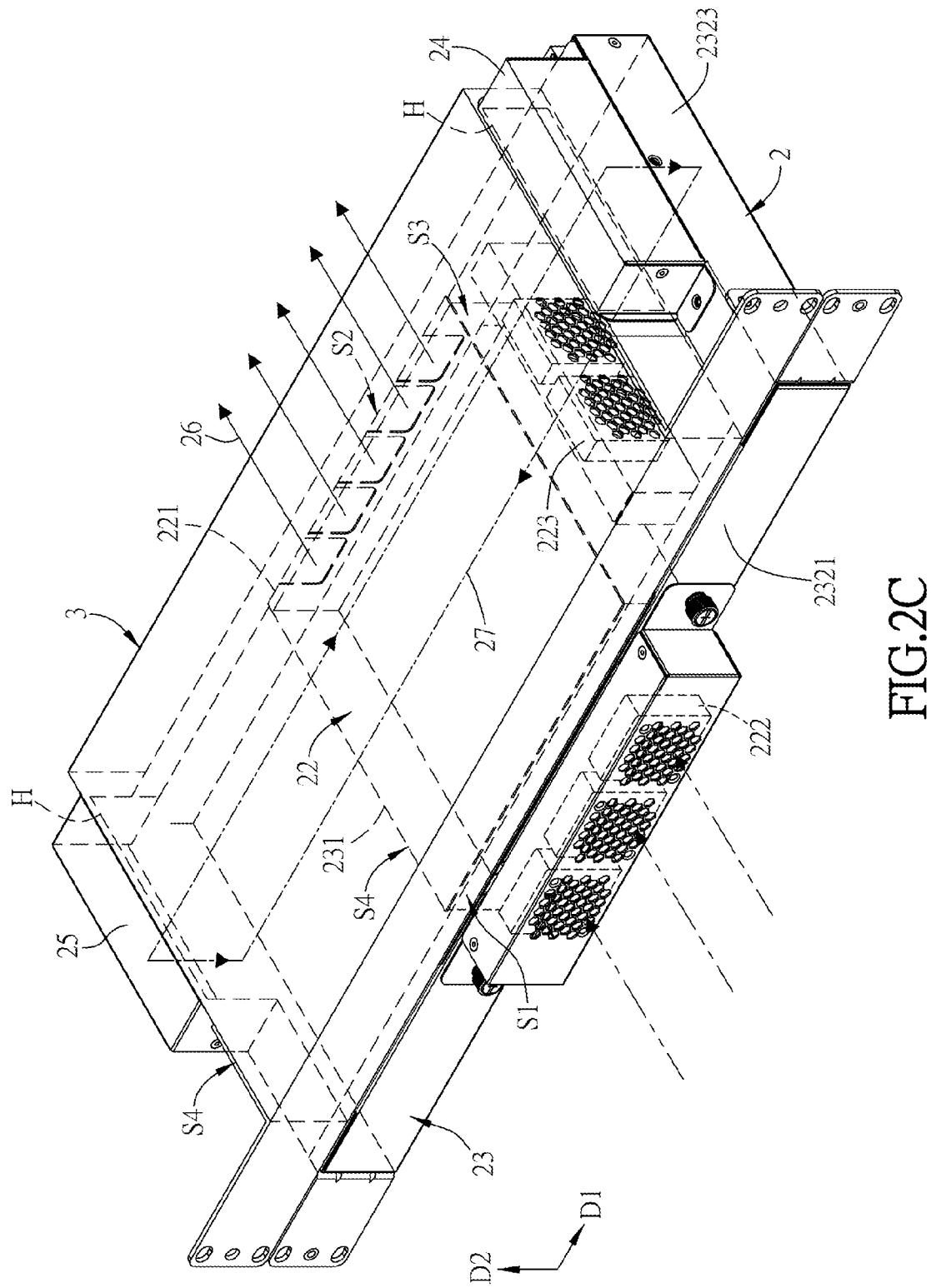

Please referred to FIG. 2A to FIG. 2C, FIG. 2A to FIG. 2C are an assembly figure, a decomposition figure and a schematic view of airflow path, respectively, of a shelf thermostat device and an electronic device according to a preferred embodiment of the present invention.

The shelf thermostat device 2 applied with at least one electronic device 3 comprises a fixing bracket 21 and a temperature regulator 22.

The electronic device 3 is detachably disposed at the fixing bracket 21. The temperature regulator 22 is also detachably disposed at the fixing bracket 21 and layer arranged in a row with the electronic device 3. In this embodiment, there are two fixing brackets 21 stand at the left and right side of the temperature regulator 22 and the electronic device 3, respectively. The temperature regulator 22 and the electronic device 3 are detachably locked on the fixing bracket by screw S, respectively, to regulate the temperature of the electronic device 3 through the temperature regulator 22. In another embodiment, the temperature regulator 22 and the electronic device 3 can also be detachably fixed on the fixing brackets 21 by interlocking; or the electronic device 3 is directly locked on and combined with the temperature regulator 22. The fixing bracket 21 is a slide structure which the temperature regulator 22 and the electronic device 3 are able to be slidably and detachably installed on, which are not limitative of the present invention.

The temperature regulator 22 and the electronic device 3 are layer arranged in a row along the first direction D1 or the second direction D2, or the temperature regulator 22 and the electronic device 3 may be obliquely layer arranged. The first direction D1 is a horizontal direction and the second direction D2 is a vertical direction. The first and second directions D1, D2 are substantially perpendicular to each other. As shown in FIGS. 2A and 2B, the fixing brackets 21 are located on the left and the right side of the temperature regulator 22 and the electronic device 3. The temperature regulator 22 and the electronic device 3 are horizontally overlapped and disposed along the second direction D2 and locked on the fixing brackets 21, respectively. In different embodiments, if the fixing brackets 21 are located above and under the thermostat 22 and the electronic apparatus 3, respectively, the electronic device 3 and the temperature regulator 22 may be layer arranged along the first direction D1, i.e. vertical arrangement, which is not limitative of the present invention.

In one embodiment, when the electronic device 3 includes a heat source, the temperature regulator 22 may be a heat exchanger (a heat dissipator), thus removing heat generated by the electronic device 3, thereby reducing the temperature of the electronic device 3 to maintain its normal operation. In another embodiment, when the electronic device 3 is located at relatively cold areas, the temperature regulator 22 may also be a heater to keep the electronic device 3 from malfunction because of the low temperature. The heater includes a heating element capable of generating heat to elevate temperature of the electronic device to maintain its normal operation.

The temperature regulator 22 is a heat exchanger, used for heat dissipation for electronic device 3, for example. Even though, the following description still refers to a temperature regulator 22.

Temperature regulator 22 (heat exchanger) has a heat exchanging core 221. The heat exchanging core 221 includes a first side S1 and a second side S2 opposite to the first side S1. The heat exchanging core 221 further includes a third S3 and a fourth side S4 opposite to the third side S3, and the third and fourth sides S3, S4 are located between the first and second sides, respectively. The heat exchanging core 221 further includes a plurality of internal circulating channels I and a plurality of external circulating channels O. An internal air flows between the internal channels I of the heat exchanging core 221 and the electronic device 3, and an external air flows to the second side S2 of the heat exchanging core 221 from the first side S1 of the heat exchanging core 221 through the external channels O. The internal air merely flows inside the electronic device 3 and the temperature regulator 22 without circulating with the air outside of the temperature regulator 22. The external air not only flows inside of the temperature regulator 22 but circulates with the air outside of the temperature regulator 22. The following will be described in detail.

Figure 2D:
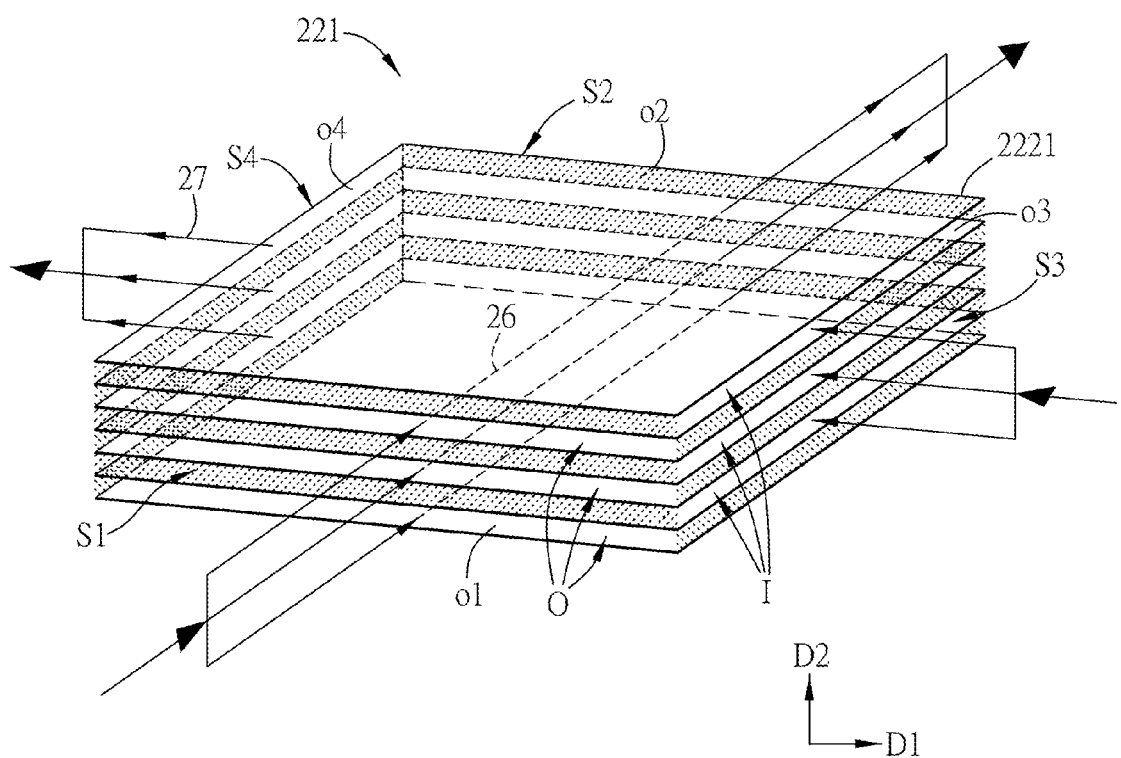

FIG. 2D is a schematic view of the heat exchanging core 221 shown in FIG. 2B. Please referred to FIGS. 2C and 2D to illustrate the principle of the heat exchanging core 221 of the temperature regulator 22 (heat exchanger) of this embodiment.

In this embodiment, the heat exchanging core 221 includes a plurality of heat dissipating fins 2221 are disposed in stacking arrangement. The heat dissipating fins 2221 are aluminum sheet as example. The present invention may use other materials with highly heat dissipation ability.

In this embodiment, as shown in FIG. 2D, the heat exchanging core 221 has six heat dissipating fins disposed adjacently in parallel arrangement. In detail, three openings o1 are formed on the first side S1 of the heat exchanging core 221 for external gas flowing in. Corresponding to the three openings o1, the other three openings o2 are formed on the second side S2 of the heat exchanging core 221. These openings o1, o2 are disposed and defining three external circulating channels O in the heat exchanging core 221. Three openings o3 are formed on the third side S3 of the heat exchanging core 221 for internal air flowing in. Corresponding to the three openings o3, the other three openings o4 are formed on the fourth side S4 of the heat exchanging core 221. These openings o3, o5 are disposed and defining three internal circulating channels I in the heat exchanging core 221.

In particular, the above-mentioned openings o3, o4 are disposed alternately. Since the opening o1, o2 are disposed alternately, the three external circulating channels are also disposed alternately. The above-mentioned three external circulating channels O and three internal circulating channels I are also disposed alternately, and vice versa, so that the three internal circulating channels I and the three external circulating channels O are disposed staggered and isolated with each other. In other words, the channels formed with the six heat dissipating fins in FIG. 2D shows an internal circulating channel I disposed adjacent to an external circulating channel O, and the air flow direction in the internal circulating channel I and that in the external circulating channel O form a substantial 90 degrees included angle. In addition, the word "substantial" mentioned above is not used for limiting the exact value of the included angle. In contrast, it contains manufacturing defects, a few special circumstances, or the error able to be tolerated by the theory and implementation, for example, but not limited to an error of plus or minus 5 degrees.

With the alternate configuration of the internal circulating channels I and the external circulating channels O, the adjacent layers are different circulating layer. The external cold air flowing through the external circulating channels O (from the first side S1) and the internal hot air flowing through the internal circulating channels I will proceed heat exchange so that the air within the external circulating channels O will be taken away by way of heat conduction through the heat dissipating fins 2221, and the hot air will further outflow from the second side S2 to complete the heat exchange process. In addition, since the heat within the internal circulating channels I is released, the internal air flow from the fourth side S4 will become cooler. The cooler air flows into the electronic device 3 to reduce the temperature of the electronic device 3 so that interlayered and cross convection structure is advantageous for enhancing the cooling efficiency.

With reference to FIGS. 2B and 2C, the shelf thermostat device 2 further includes at least a first fan 222 and at least a second fan 223. The first and second fans 222, 223 generate the above-mentioned external air and the internal air, respectively, during operating. The first fan 222 is disposed at the first or second sides S1, S2 of the heat exchanging core 221, and the second fan 223 is disposed on the third side S3 or the fourth side S4 of the heat exchanging core 221. The present embodiment includes three first fans 222 and two second fans 223. The first fans 222 are external circulating fans installed at the first side S1 of the heat exchanging core 221, respectively, and the second fans 223 are internal circulating fans installed at the third side S3 of the heat exchanging core 221. The numbers of the first and second fans 222, 223 are not for limitation. The first and second fans 222, 223 of the present invention are axial flow fans, however, other types of fan, such as a crosscurrent fan or a diagonal flow fan may be applied in the present invention. In this embodiment, the first and second fans 222, 223 are accommodated in the case and connected with the external air through the multiple openings of the case.

In addition, in this embodiment, the shelf thermostat device 2 further includes a support housing 23 and two air shields. The heat exchanging core 221 is disposed at the fixing bracket 21 by the support housing 23. The support housing 23 includes an outer casing 231, and the heat exchanging core 221 is covered by the outer casing 231 of the support housing 23. The outer casing includes an opening corresponding to the first fan 222 and second fan 223 (not shown in figure), so that the external air may be brought into the external circulating channels O through the openings of the outer casing 23 by the first fan 222, and the internal air may be brought into the internal circulating channels I through the openings of the outer casing 23 by the second fan 223.

In addition, the support housing 23 further includes a plurality of branch portions. The branch portions include a first branch portion 2321 corresponding to the first side S1, a second branch portion 2322 corresponding to the second side S2, a third branch portion 2323 corresponding to the third side S3, and a fourth branch portion 2324 corresponding to the fourth side S4. The first branch portion 2321, the second branch portion 2322, the third branch portion 2323, and the fourth branch portion 2324 are connected with each other, and the temperature regulator 22 is located in the space surrounded by the first branch portion 2321, the second branch portion 2322, the third branch portion 2323, and the fourth branch portion 2324. The first and second branch portions 2321, 2322 are connected with the outer casing 231, respectively. In addition, the air shield 24 is disposed on the third branch portion 2323, and the air shield 25 is correspondingly disposed on the fourth branch portion 2324. The air shields 24, 25 covers the two openings H of the electronic device 3, respectively, i.e. the openings H are connected with the internal space of the electronic device 3.

With reference to FIGS. 2C and 2D, the first fan 222 brings the external air with lower temperature outside of the temperature regulator 22 from the opening of corresponding to the first side S1 into the external circulating channels O. The air temperature will rise due to the heat exchange process of the heat dissipating fins, and the air will further outflow through the opening o2 on the second side S2 of the heat exchanging core 221, which is the external air of the present invention. The external air and the air outside of the temperature regulator 22 are in connection and forming an open system communicating with the exterior of the device, which is an external circulating path 26. In addition, the temperature of the air corresponding to the third side S3 with heat generated from inside of the electronic device 3 is higher, and the air flow out of the electronic device 3 from the right opening H. When the second fans 223 bring the air into the internal circulating channels I through the opening o3 on the third side S3, the air is able to undergo the heat exchanging process of the heat dissipating fins 2221 and become the air with lower temperature so that the hot air is transmitted to the external air by the heat dissipating fins 2221. Then the air outflow from the opening o4 of the fourth side S4 of the heat exchanging core 221. With the guidance of the air shield 25, the air with lower temperature is able to pass through another opening H on the left side of the electronic device 3, and then flow back to the electronic device. The above-mentioned circulation is the so-called internal air of the present invention which is only circulated in the device without contacting with the environment outside of the device. The temperature regulator 22 (heat exchanger) construct a hermetic circuit together with the electronic device 3 or the fixing bracket 21. In the present embodiment, the internal circulating channels I, the support housing 23 and the air shields 24,25 the heat exchanging core 221 of the temperature regulator 22 (heat exchanger) construct a hermetic circuit together with the electronic device 3. The internal air is capable of flowing in the hermetic circuit, and the path that the internal air flowing pass by forms an internal circulating path 27.

Figure 3:
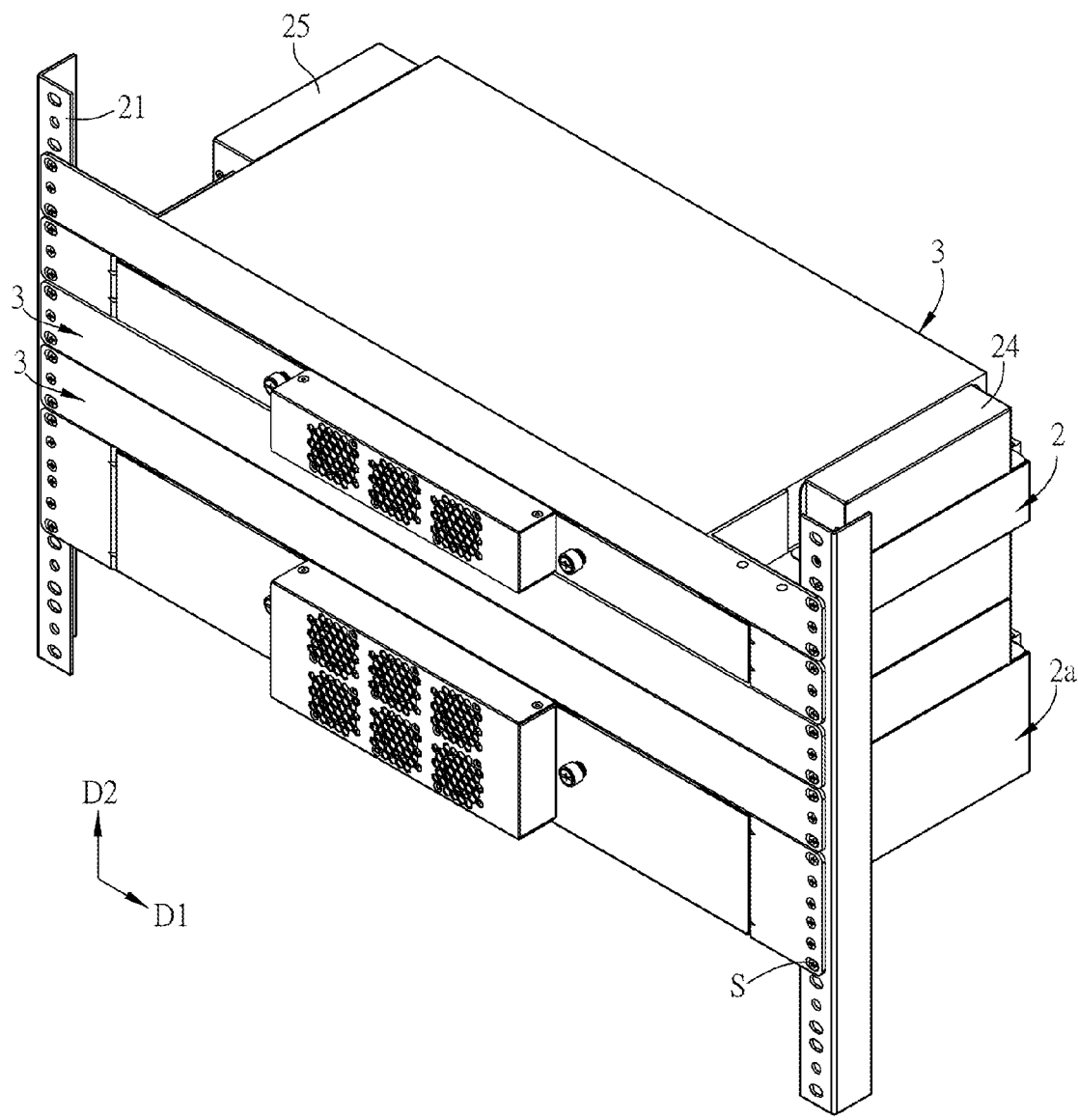
FIG. 3 schematically shows an assembly figure of a shelf thermostat and an electronic device according to another embodiment of the present invention.

FIG. 3 schematically shows an assembly figure of a shelf thermostat and an electronic device according to another embodiment of the present invention.

In this embodiment, a shelf thermostat device 2a, two electronic devices 3, a shelf thermostat device 2, and an electronic device 3 stacked from the bottom to the upside in the device. The shelf thermostat devices 2, 2a share two fixing brackets 21 with the three electronic devices 3. The shelf thermostat devices 2, 2a are heat exchangers. The shelf thermostat device 2a and the shelf thermostat device 2 include the same elements and technique features. However, the size of the temperature regulator of the shelf thermostat device 2a and the amount or the size of the corresponding fan are more or larger according to the electronic devices 3 stacked above, thus achieving better heat dissipation ability. The technical features of the shelf thermostat device 2 have been detailed descripted above, and the technique feature of the shelf thermostat device 2a can be referred to the same, and are not repeated here. Compared to the long time the prior techniques takes, the shelf thermostat device of the present invention do not need to modify the case, and the electronic device will not have the problem of uneven heat dissipation or heating.

Figure 4:
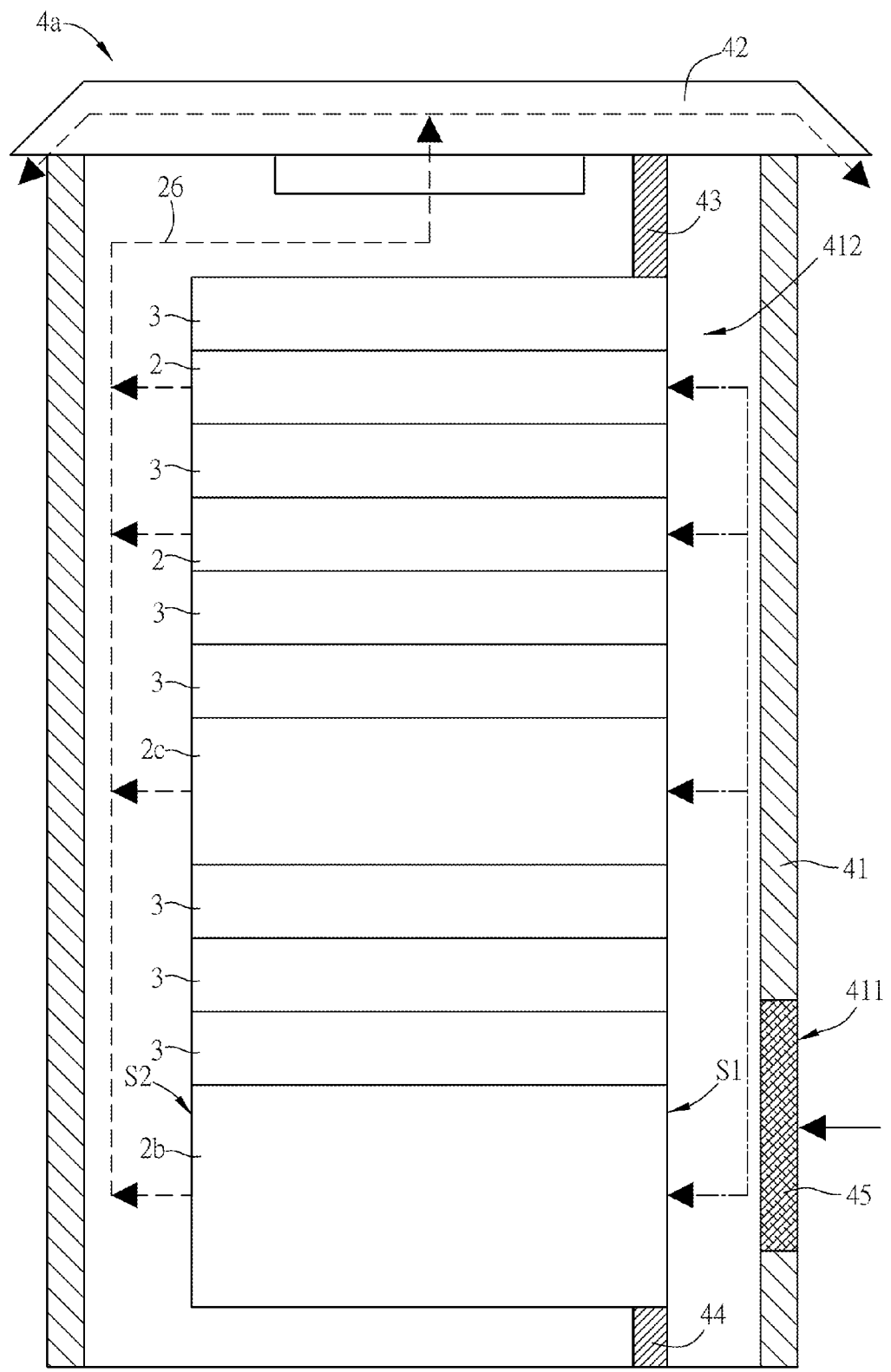
FIGS. 4 and 5 are different schematic views of a thermostat system according to a preferred embodiment of the present invention.
Figure 5:
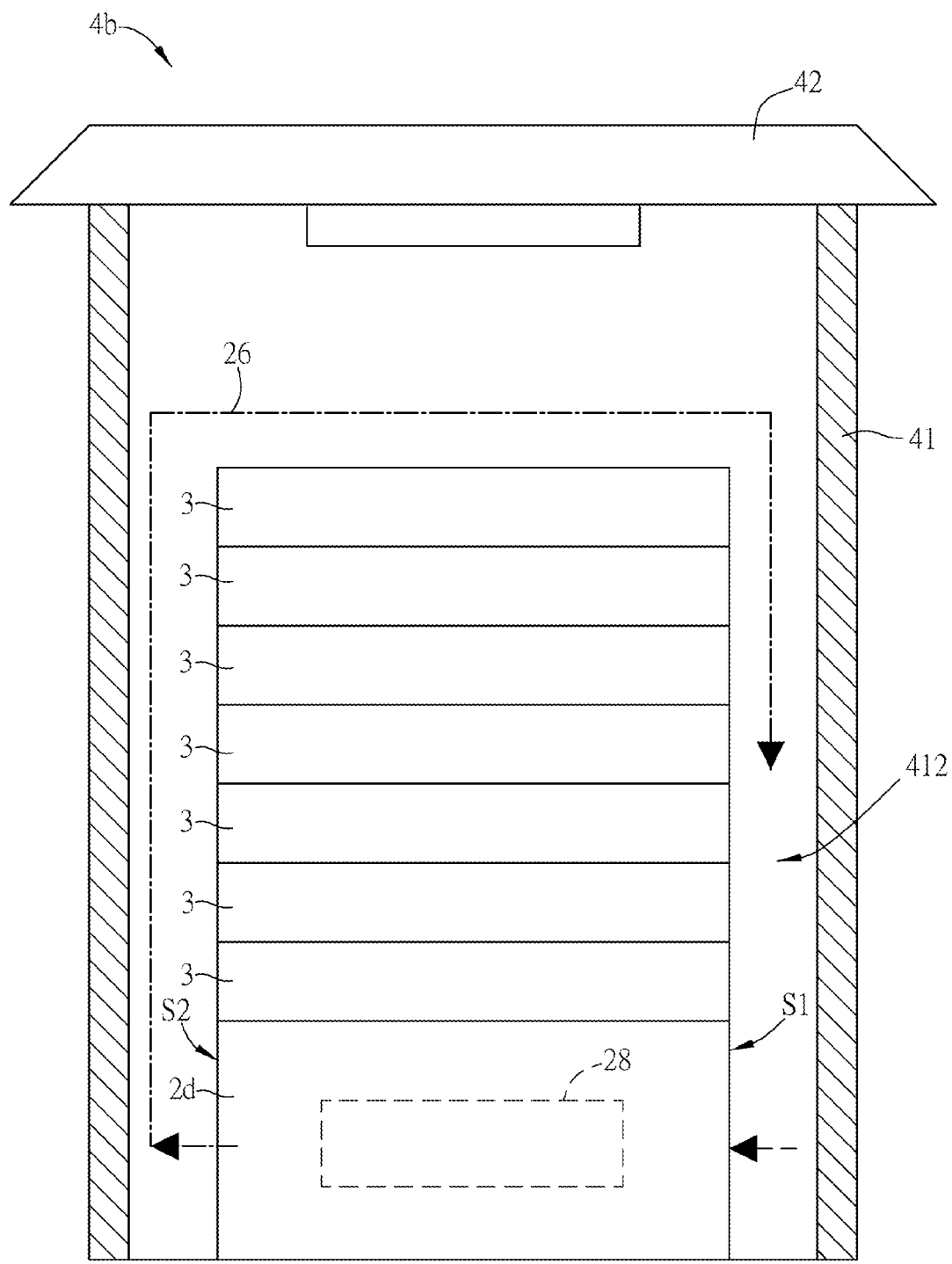

FIGS. 4 and 5 are different schematic views of a thermostat system according to a preferred embodiment of the present invention.

As shown in FIG. 4, the thermostat system 4a includes a main body 41, at least an electronic device and at least a shelf thermostat device.

The main body 41 may, for example, but not limited to be a building or a cabinet. The building is such as a server room or a power supply room for installing communication device. The cabinet is such as, but not limited to, the case of an electronic device. The main body 41 includes an accommodating space 412.

The shelf thermostat device applied with an electronic device, and the electronic device and the shelf thermostat device are disposed in the accommodating space 412. The shelf thermostat device may include a fixing bracket (not shown in the figure) and a temperature regulator, and the shelf thermostat device and the electronic device are disposed at the fixing bracket, respectively, and layer arranged in a row with the electronic device.

The temperature regulator of the present embodiment is a heat exchanger used for heat dissipation of the electronic device. As shown in FIG. 4A, the amount of the electronic devices 3 is seven, and the amount of the shelf thermostat devices is four. The the arrangement from bottom to top are shelf thermostat devices 2b, 2c, 2, and 2. Therefore, in response to the numbers of the electronic device 3 of thermostat system 4a, three electronic devices 3 are stacked above the shelf thermostat device 2b in this embodiment. A shelf thermostat device 2c and the other three electronic devices 3 are stacked above the three electronic devices 3. Next, a shelf thermostat device 2, an electronic device 3, another shelf thermostat device 2 and another electronic device 3 are stacked sequentially. Similar to FIG. 3, the shelf thermostat devices 2b, 2c include the same elements and the technique features as the shelf thermostat device 2. However, the shelf thermostat devices 2b, 2c might have different amount of the electronic devices 3 according to the cooling requirement. The technique feature of the shelf thermostat device 2a can be referred to the same, and are not repeated here.

Since the internal air of the shelf thermostat devices 2b, 2c and 2 merely flow between the internal circulating channels of the temperature regulator and the electronic device 3 (hermetic circuit). Therefore, FIG. 4 does not show the internal air and the internal circulating path. The arrows shown in FIG. 4 show the external circulating paths 26 of the external air. In addition, the thermostat system 4 further includes at least a bulkhead. The present embodiment takes two bulkheads 43, 44 for example. The bulkhead 43 is disposed on the uppermost electronic device 3, and the bulkhead 44 is disposed between the shelf thermostat 2b and the bottom of the main body 41. The bulkheads 43, 44 are capable of isolating the external air corresponding to the first and second sides S1, S2 to prevent the cooler air on the first side S1 mixing with the hotter air on the second side S2.

In addition, the thermostat system 4a further includes a top portion 42. The top portion 42 is a cover body connected with the main body 41 to form the accommodating space 412. The top portion 42 includes at least one exit. The external air flows into the accommodating space 412 through an opening 411s. After passing through the shelf thermostat device 2b, 2c and 2 and completing heat exchanging process, the external air discharges from the outlet of the top portion 2 to the external environment. Certainly, the top portion 42 may also be provided with a fan to forcibly eject the external air with higher temperature. Inlet 411 can be provided with a filter 45 to filter air so that dust is unable to accumulate on the shelf thermostat device 2 or the electronic device 3.

In addition, as shown in FIG. 5, the thermostat system also includes a main body 41, at least an electronic device, and at least a shelf thermostat system.

The features of the main body 41 can be referred to the same, and are not repeated here. The shelf thermostat system applies with the electronic device, and the electronic device and the shelf thermostat device are disposed in the accommodating space 412, respectively. The shelf thermostat device includes a fixing bracket (not shown in figure) and a temperature regulator. The shelf thermostat device and the electronic device are disposed on the fixing bracket, and the shelf thermostat device is disposed closely and layer arranged in a row with the electronic device.

In this embodiment, the thermostat system 3b is located at relatively cold areas (such as snow areas), the temperature regulator 22 may also be a heater to keep the electronic device 3 from malfunction because of the low temperature.

As shown in FIG. 4B, the amount of the electronic device 3 of the present embodiment is seven, and the amount of the shelf thermostat device (heater) is only one. The electronic devices 3 sequentially stacked on the shelf thermostat device 2. In addition, the shelf thermostat device 2d includes a heating element 28, and the external air can be evacuated form the first side S1 to the shelf thermostat device 3s by the fan, further heated with heating element 28, so that the external air exhausting out of the second side S2 may include higher temperature. For the requirement of ventilation, the main body 41 may also include an inlet (not shown in figure) to exhaust the air from external part into the main body 41. The top portion 42 of the present embodiment does not have an external outlet. However, in other embodiment, the top portion 42 can be disposed with an outlet and an exhaust fan in order to exhaust the air within the main body 41 out of the same.

In particular, the heating element 28 of the shelf thermostat device 2d can be turned off while the temperature is rising at the location of the thermostat system 4b. In other embodiment, the shelf thermostat device 3d may also include all the technique features of the above-mentioned shelf thermostat system 2 (with cooling function). Therefore, the shelf thermostat system may include both of the heating and hot exchanging functions. Users can turn on the heater or the heat exchanger according to its demand, which are not limitative of the present invention.

As mentioned above, the shelf thermostat device and the thermostat system of the present invention can be designed according to the heat exchange requirements of the electronic device. Compared to the prior techniques, the shelf thermostat device of the present invention do not need to modify the case, and the electronic device will not have the problem of uneven heat dissipation or heating. In addition, the fan operation sound of shelf thermostat device is unable to transmit to the external environment. Therefore, noise problem can be solved, and the waterproof and dustproof level are not necessary to strengthen. Since the shelf thermostat device and the thermostat system having the same are both modular design, any broken shelf thermostat device can be easily swapped, so that the installation and maintenance is also very convenient and easy.

As mentioned above, the shelf thermostat device and the thermostat system of the present invention can be designed according to the heat exchange requirements of the electronic device. Compared to the prior techniques, the shelf thermostat device of the present invention do not need to modify the case, and the electronic device will not have the problem of uneven heat dissipation or heating. In addition, the fan operation sound of shelf thermostat device is unable to transmit to the external environment so that noise problem can be solved and the waterproof and dustproof level are not necessary to strengthen. Since the shelf thermostat device and the thermostat system having the same are both modular design, any broken shelf thermostat device can be easily swapped so that the installation and maintenance is also very convenient and easy.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A shelf thermostat device applied with at least one electronic device, comprising:
  a fixing bracket, wherein the electronic device is detachably disposed at the fixing bracket;
  a heat exchanger detachably disposed at the fixing bracket and layer arranged in a row with the electronic device, the heat exchanger has a heat exchanging core, the heat exchanging core has a first side and a second side opposite to the first side, and a plurality of internal circulating channels and a plurality of external circulating channels, the internal circulating channels and the external circulating channels are disposed staggered and isolated with each other,
  wherein an internal air flows between the internal circulating channels and the electronic device, and an external air flows to the second side of the heat exchanging core from the first side of the heat exchanging core through the external circulating channels.

2. The shelf thermostat device as recited in claim 1, wherein the heat exchanger constructs a hermetic circuit together with the electronic device or the fixing bracket, and the internal air flows in the hermetic circuit.

3. The shelf thermostat device as recited in claim 1, further comprising:
  at least a first fan disposed at the first or second side of the heat exchanging core, and the first fan operates to form the external air.

4. The shelf thermostat device as recited in claim 1, further comprising:
  at least a second fan disposed at a third side or a fourth side opposite to the third side, the third and fourth sides are located between the first and second sides, respectively, and the second fan operates to form the internal air.

5. The shelf thermostat device as recited in claim 4, further comprising:
  a support housing and two air shields, the heat exchanging core is disposed at the fixing bracket by the support housing, the support housing includes two branch portions corresponding to the third and fourth sides, the air shields are correspondingly disposed at the branch portions and covering the two openings of the electronic device, respectively.

6. A shelf thermostat device applied with at least one electronic device, comprising:
a fixing bracket, wherein the electronic device is detachably disposed at the fixing bracket; and
a temperature regulator detachably disposed at the fixing bracket and layer arranged in a row with the electronic device, wherein the temperature regulator has a plurality of internal circulating channels and a plurality of external circulating channels, and the internal circulating channels and the external circulating channels are disposed staggered and isolated with each other.

7. The shelf thermostat device as recited in claim 6, wherein the temperature regulator is a heat exchanger or a heater.

8. The shelf thermostat device as recited in claim 6, wherein the temperature regulator is a heat exchanger, the heat exchanger has a heat exchanging core, the heat exchanging core has a first side and a second side opposite to the first side, and the internal circulating channels and the external circulating channels, an internal air flows between the internal circulating channels and the electronic device, and an external air flows to the second side of the heat exchanging core from the first side of the heat exchanging core through the external circulating channels.

9. The shelf thermostat device as recited in claim 8, wherein the heat exchanger construct a hermetic circuit together with the electronic device or the fixing bracket, and the internal air flows in the hermetic circuit.

10. The shelf thermostat device as recited in claim 8, further comprising:
at least a first fan disposed at the first or second side of the heat exchanging core, and the first fan operates to form the external air.

11. The shelf thermostat device as recited in claim 8, further comprising:
at least a second fan disposed at a third side or a fourth side opposite to the third side, the third and fourth sides are located between the first and second sides, respectively, and the second fan operates to form the internal air.

12. The shelf thermostat device as recited in claim 11, further comprising:
a support housing and two air shields, the heat exchanging core is disposed at the fixing bracket by the support housing, the support housing includes two branch portions corresponding to the third and fourth sides, the air shields are correspondingly disposed at the branch portions and covering the two openings of the electronic device, respectively.

13. A thermostat system, comprising:
a main body including an accommodating space;
at least an electronic device disposed at the accommodating space; and
at least a shelf thermostat device disposed at the accommodating space and applied with the electronic device, comprising:
a fixing bracket, wherein the electronic device is detachably disposed at the fixing bracket; and
a temperature regulator detachably disposed at the fixing bracket and layer arranged in a row with the electronic device, wherein the temperature regulator has a plurality of internal circulating channels and a plurality of external circulating channels, and the internal circulating channels and the external circulating channels are disposed staggered and isolated with each other.

14. The thermostat system as recited in claim 13, wherein the main body is a building or a cabinet.

15. The thermostat system as recited in claim 13, wherein the temperature regulator is a heater, the electronic overlays on the heater.

16. The thermostat system as recited in claim 13, wherein the temperature regulator is a heat exchanger, the heat exchanger has a heat exchanging core, the heat exchanging core has a first side and a second side opposite to the first side, and the internal circulating channels and the external circulating channels, an internal air flows between the internal circulating channels and the electronic device, and an external air flows to the second side of the heat exchanging core from the first side of the heat exchanging core through the external circulating channels.

17. The thermostat system as recited in claim 16, wherein the shelf thermostat device further comprises at least a first fan, the first fan is disposed at the first or second side of the heat exchanging core, and the first fan operates to form the external air.

18. The thermostat system as recited in claim 16, wherein the shelf thermostat device further comprises at least a second fan, the second fan is disposed at a third side or a fourth side opposite to the third side, the third and fourth sides are located between the first and second sides, respectively, and the second fan operates to form the internal air.

19. The thermostat system as recited in claim 18, wherein the shelf thermostat device further comprises a support housing and two air shields, the heat exchanging core is disposed at the fixing bracket by the support housing, the support housing includes two branch portions corresponding to the third and fourth sides, the air shields are correspondingly disposed at the branch portions and covering the two openings of the electronic device, respectively.

20. The thermostat system as recited in claim 16, further comprising:
at least a bulkhead configured to separate the external air corresponding to the first and second sides.

* * * * *